United States Patent
Pfeifer et al.

(10) Patent No.: US 7,984,605 B2
(45) Date of Patent: Jul. 26, 2011

(54) CABLE CHAIN RETURN SYSTEM AND ASSOCIATED METHODS

(75) Inventors: Alan Pfeifer, Wichita, KS (US); John Dunham, Kechi, KS (US); Ryan Signer, Derby, KS (US)

(73) Assignee: NetAPP, Inc., Sunnyvale, CA (US)

( * ) Notice: Subject to any disclaimer, the term of this patent is extended or adjusted under 35 U.S.C. 154(b) by 288 days.

(21) Appl. No.: 12/417,510

(22) Filed: Apr. 2, 2009

(65) Prior Publication Data

US 2010/0058728 A1    Mar. 11, 2010

Related U.S. Application Data

(63) Continuation-in-part of application No. 12/208,182, filed on Sep. 10, 2008, now Pat. No. 7,552,581.

(51) Int. Cl.
*H02G 3/04* (2006.01)
*F16G 13/00* (2006.01)

(52) U.S. Cl. ............. 59/78.1; 248/49; 174/72 A

(58) Field of Classification Search ........... 59/78.1, 59/900; 248/49, 51; 174/72 A; 296/155; 49/360
See application file for complete search history.

(56) References Cited

U.S. PATENT DOCUMENTS

| | | | |
|---|---|---|---|
| 4,392,344 A | 7/1983 | Gordon et al. | |
| 6,374,589 B1 | 4/2002 | Kunert et al. | |
| 6,781,058 B1 * | 8/2004 | DeCicco et al. | 174/72 A |
| 6,787,702 B2 | 9/2004 | Suzuki | |
| 6,896,344 B2 * | 5/2005 | Tsutsumi et al. | 59/78.1 |
| 6,940,019 B2 * | 9/2005 | Ikeda et al. | 248/49 |
| 6,996,967 B2 * | 2/2006 | Kobayashi | 59/78.1 |
| 7,082,720 B2 * | 8/2006 | Kobayashi et al. | 49/360 |
| 7,284,785 B2 * | 10/2007 | Gotou et al. | 296/155 |
| 7,484,351 B2 | 2/2009 | Harada et al. | |
| 7,552,581 B1 * | 6/2009 | Pfeifer et al. | 59/78.1 |

OTHER PUBLICATIONS

U.S. Appl. No. 12/208,182, filed Sep. 10, 2008.

* cited by examiner

*Primary Examiner* — David B Jones

(57) ABSTRACT

Disclosed is a cable chain return system 100 that includes a spring 170 for assisting folding and organization of a cable chain 110. When a customer replaceable unit (CRU) 210 is extended from a chassis 140 to gain access to connectors on the back of the CRU 210, the cable chain 110 is extended. When the CRU 210 is moved back into the chassis 140, a plurality of folding curves 130 organize the cable chain 110, and cables 118 therein, without damaging the cables 118 or inhibiting positioning of the CRU 210 in the chassis 140. One of these curves 130 is initiated by the spring 170 and therefore aids in returning and organizing of the cable chain 110.

11 Claims, 6 Drawing Sheets

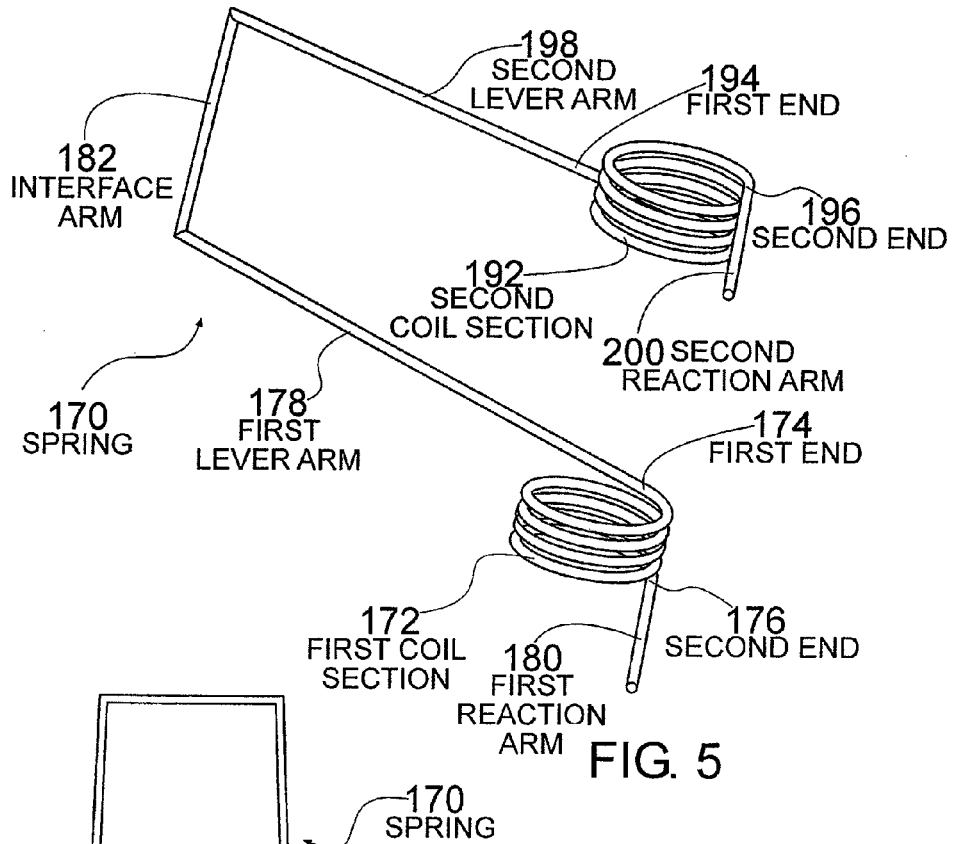
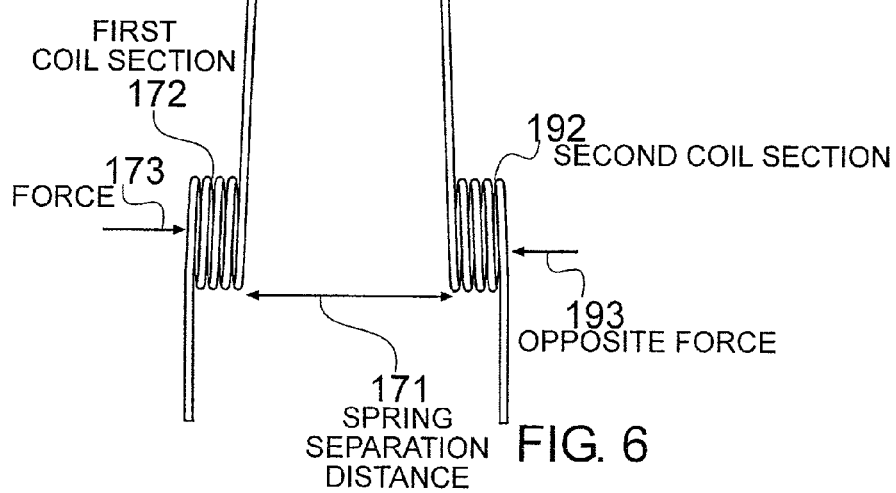

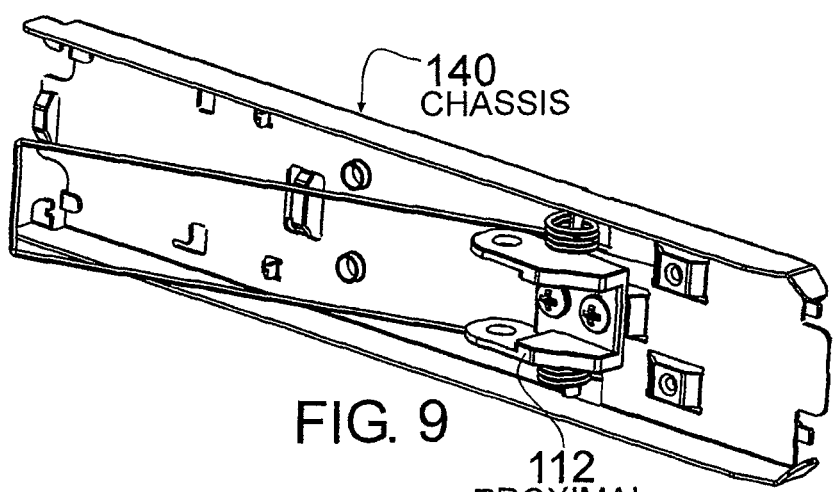
FIG. 9
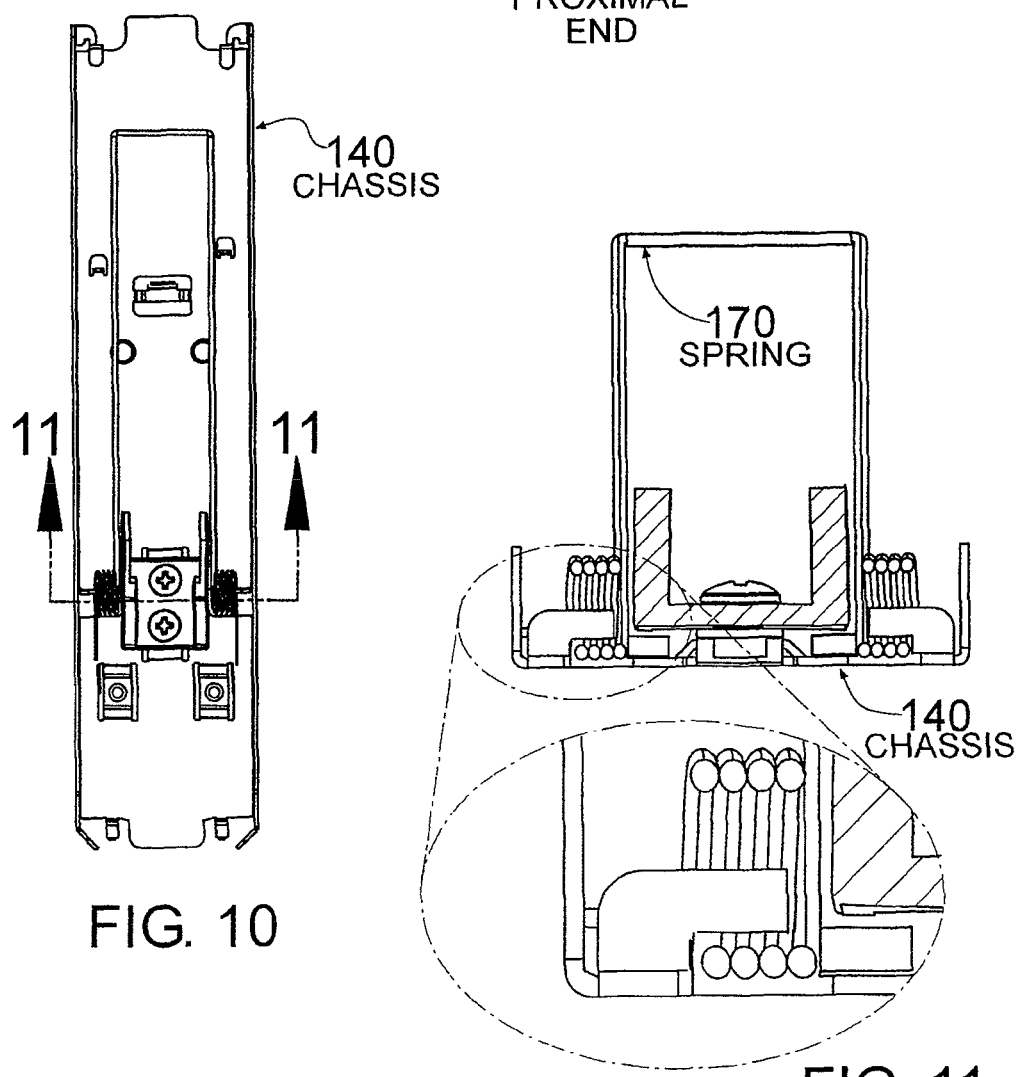
FIG. 10
FIG. 11

US 7,984,605 B2

CABLE CHAIN RETURN SYSTEM AND ASSOCIATED METHODS

CROSS REFERENCE TO RELATED APPLICATION

The present application is a continuation-in-part of U.S. Non-Provisional patent application Ser. No. 12/208,182 entitled "ARTICULATING CABLE CHAIN ASSEMBLY", and filed Sep. 10, 2008 by ALAN T. PFEIFER. The aforementioned application is assigned to an entity common hereto, and the entirety of the aforementioned application is incorporated herein by reference for all that it discloses and teaches.

BACKGROUND OF THE INVENTION

Customer replaceable units (CRUs) have provided a convenient and simple way of replacing appliances such as disk drives in servers, RAID devices, etc. Drives, such as hot spares, mirror drives in a RAID unit, or any type of replacement drive can be easily removed or replaced using CRU devices. Disk drives can be plugged and unplugged from the chassis of RAID units, servers, computers, etc. with cables having connectors that connect to the back of the unit. Hence, the CRUs are a practical and convenient way to replace appliances, such as disk drives, that are utilized in the computer and electronics industry.

SUMMARY OF THE INVENTION

An embodiment of the present cable chain return system may include a method of returning a cable chain from an extended position to a retained position, the method comprising: providing a cable chain made from a plurality of links having a limited arc of rotation, the links periodically reversed on the articulated cable chain so that the cable chain forms a plurality of folding curves in sequentially opposite directions along the cable chain when the cable chain is in a retained position, the cable chain defining: a proximal end attached to the chassis, a distal end oppositely disposed from the proximal end and attached to a customer replaceable unit; a biased section adjoining the proximal end; and, placing a spring adjacent to the cable chain proximal end that engages the cable chain biased section and the chassis so that the spring biases the cable chain biased section towards the chassis to initiate forming of the plurality of folding curves when the customer replaceable unit is moved from the extended position to the retained position.

An embodiment of the present cable chain return system may include a cable chain return system connected to a customer replaceable unit and a chassis, the cable chain return system comprising: a cable chain made from a plurality of links that have a limited arc of rotation, the links periodically reversed on the cable chain so that the cable chain forms a plurality of folding curves in sequentially opposite directions along the cable chain when the a cable chain is in a retained position, the cable chain defining: a proximal end attached to the chassis, a distal end oppositely disposed from the proximal end and attached to the customer replaceable unit, a biased section adjoining the proximal end; and, a spring attached to the chassis adjacent to the cable chain proximal end adjoining the cable chain biased section, the spring disposed on the chassis to bias the cable chain biased section towards the chassis for initiating the plurality of folding curves when the cable chain moves from an extended position to the retained position.

An embodiment of the present cable chain return system may include a method of installing a cable chain return system for a customer replaceable unit in a chassis that extends from the chassis, the method comprising: providing a cable chain made from a plurality of links that have a limited arc of rotation, the links periodically reversed on the articulated cable chain so that the cable chain forms a plurality of folding curves in sequentially opposite directions along the cable chain when the cable chain is in a retained position, the cable chain defining a proximal end and an oppositely disposed distal end; providing a spring comprising: a first coil section and a second coil section integrally formed with the first coil section separated by a spring separation distance from the first coil section; squeezing the spring first and second coil sections causing the spring separation distance to decrease; positioning the spring adjacent to the chassis, after the squeezing the spring; releasing the spring, after the positioning the spring; positioning the cable chain proximal end between the first coil section and the second coil section, after the releasing the spring; and, attaching the cable chain to the chassis between the spring first and second coil sections thereby installing the cable chain return.

BRIEF DESCRIPTION OF THE DRAWINGS

FIG. 1b is a top plan view of the embodiment of the cable chain return system of FIG. 1a.

FIG. 5 is a perspective view of the embodiment of the spring of FIG. 1a.

FIG. 6 is a top plan view of the embodiment of the spring of FIG. 5.

FIG. 9 is a perspective view of another embodiment of a spring interfaced with a chassis.

FIG. 10 is a top plan view of the embodiment of the chassis and the interfaced spring of FIG. 9.

FIG. 11 is a cross-sectional view of the embodiment of the chassis and the interfaced spring taken across plane 11-11 of FIG. 10.

DETAILED DESCRIPTION OF THE EMBODIMENTS

Figure 1A:
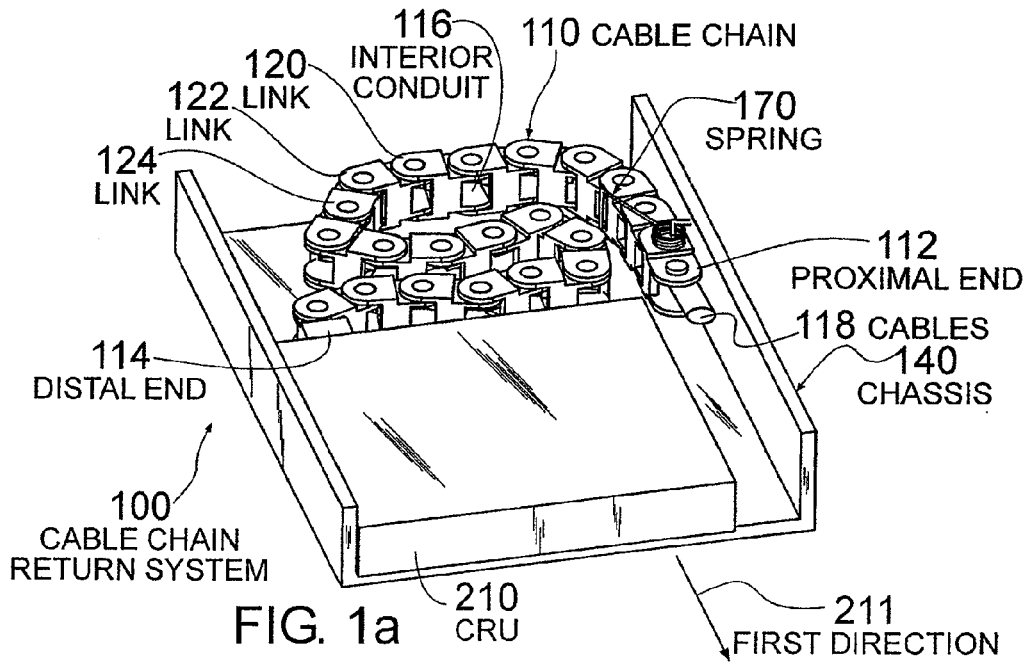
FIG. 1a is a perspective view of an embodiment of a cable chain return system that is in a retained position.
Figure 1B:
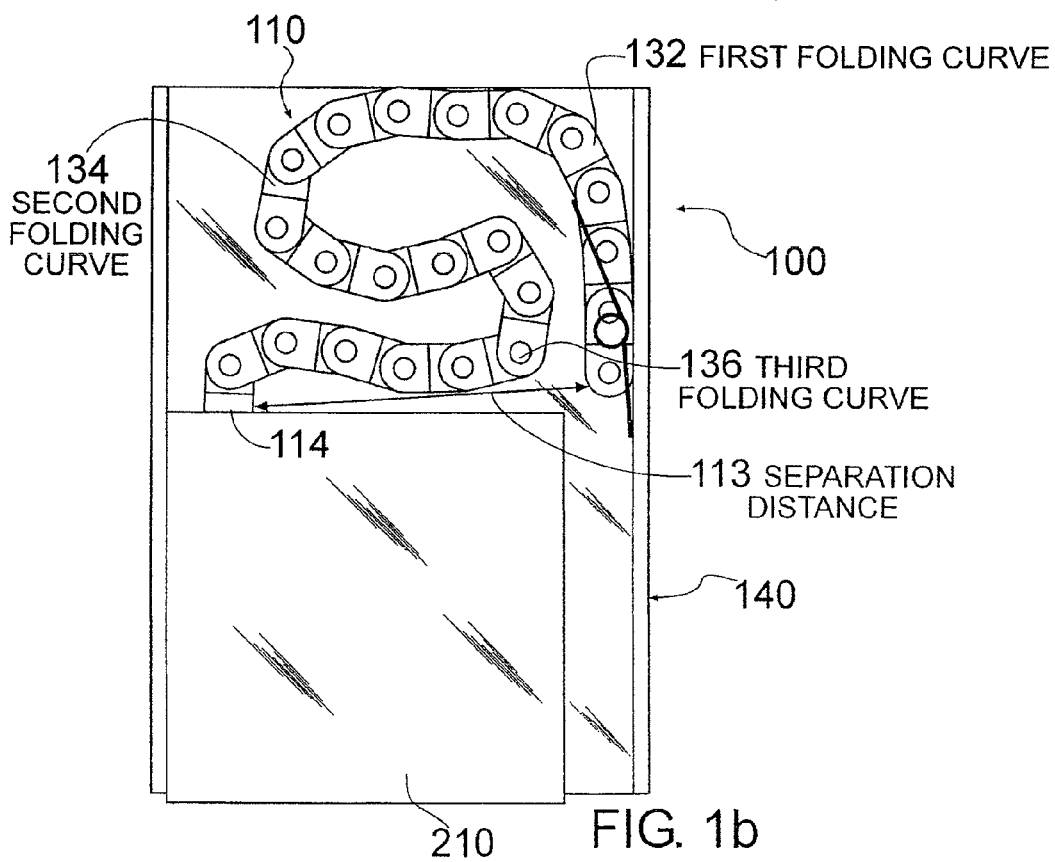
Figure 2:
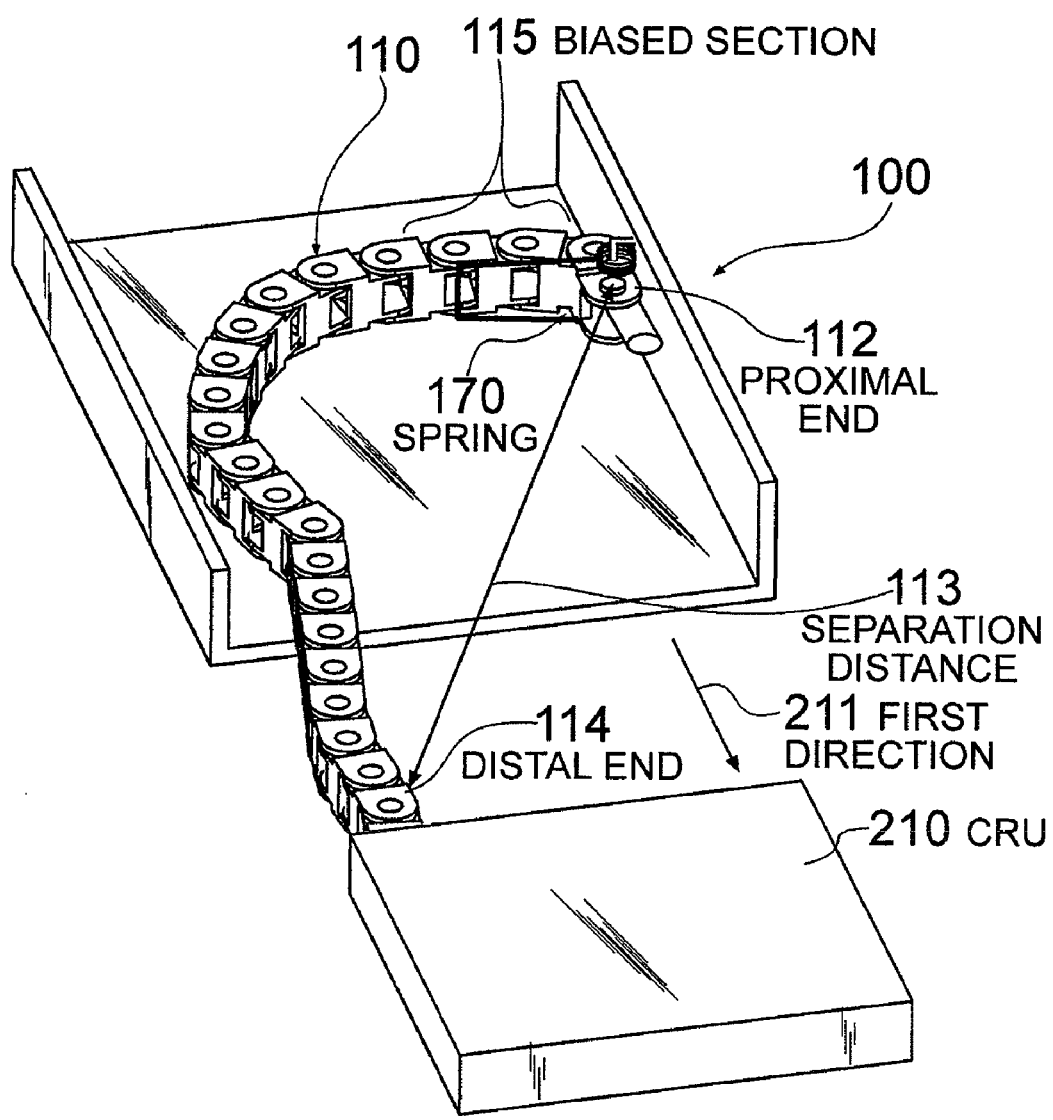
FIG. 2 is a perspective view of the cable chain return system of FIG. 1a in an extended position having a CRU that can be released from the cable chain.

FIGS. 1-8, in general, illustrate an embodiment of a cable chain return system 100 provided with a cable chain 110, a chassis 140, a spring 170 and a customer replaceable unit (CRU) 210. The cable chain 110 is connected between the chassis 140 and the CRU 210. The cable chain 110 protects and carries cables 118 that provide electrical communication between electrical components (not shown) of the chassis 140 and the CRU 210. The cable chain 110 assist in folding the cables 118 in a series of sequentially opposite curves in a "S" formation, so that the cables 118 do not become entangled during movement. The present cable chain return system 100 utilizes the spring 170 for returning the cable chain 110 after it has been extended (as illustrated in FIG. 2) during replacement of the CRU 210 as described later herein.

FIG. 1a is a perspective view of one exemplary embodiment of the cable chain system 100 in a retained condition. The system 100 is provided with the cable chain 110 defining a proximal end 112 and an oppositely disposed distal end 114. Cable chain 110 is further provided with a biased section 115 (FIG. 2) adjacent to the proximal end 112. The biased section 115 extends for a short distance of the cable chain 110, e.g. four links of the cable chain 110. Disposed between the proximal end 112 and distal end 114 is an interior conduit 116 for receiving the cables 118. The cable chain 110 includes a plurality of links, e.g. individual links 120, 122, 124, creating an assemblage that defines range of motion and provides the flexible interior conduit 116 for cables 118. The cables 118 are disposed in the cable chain interior conduit 116 and flex with the cable chain 110 as illustrated in the figures.

FIG. 1b is a top plan view of the cable chain return system 100 in the retained condition of FIG. 1a. The cable chain 110 is folded to form a series of interlinking folds in the cable chain 110 that curve in opposite directions sequentially along the length of the cable chain 110. The individual links 120, 122, 124, etc. (FIG. 1a) that form the cable chain 110 have a limited arc of rotation so that the cable links rotate in only one direction. The links of the cable chain 110 are assembled to create a plurality of folding curves 130, e.g. first folding curve 132, second folding curve 134, and third folding curve 136 as desired. Some of the folding curves 130 are sequentially reversed, for example second folding curve 134 reversed from third folding curve 136. When the folding curves 130 are sequentially reversed they can curve in sequentially opposite directions along the length of the cable chain 110. It is desirable to ensure that the folding curves 130 are tightly formed in the retained condition, and that the folding curves 130 are properly initiated when the CRU 210 is in an extended position in the chassis 140 and begins to move to the retained position. If the folding curves 130 in the cable chain 110 are not properly initiated, the cable chain 110 may not properly initiate a folding action, which may prevent the CRU 210 from being stored in the chassis 140 in the manner illustrated in FIGS. 1a and 1b. The spring 170 improves proper folding of the first folding curve 132 and initiates the other folding curves 134, 136.

FIG. 2 shows the cable chain return system 100 in an extended condition. Cable chain 110 is extended such that the proximal end 112 is located from the distal end 114 by a separation distance 113. The separation distance 113 changes as the cable chain return system 100 is utilized. In the retained condition, the CRU 210 is engaged to and supported by the chassis 140 and the separation distance 113 is relatively short, as illustrated in FIG. 1b. In the extended condition, the CRU 210 is able to be disengaged and is not supported by the chassis 140 and the separation distance 113 is relatively long. In this extended condition, the cable chain return system 100 has return energy stored in the spring 170. The return energy in the spring 170 is utilized for folding and organizing the cable chain 110 as it moves to a retained position required for the retained condition. Specifically, the return energy in the spring 170 biases the biased section 115 (FIG. 2) of the cable chain 110 towards the chassis 140. In biasing the cable chain 110 towards the chassis 140, the first folding curve 132 is formed as best illustrated in FIG. 1b. The particular operation of the spring 170 is detailed below.

Figure 3:
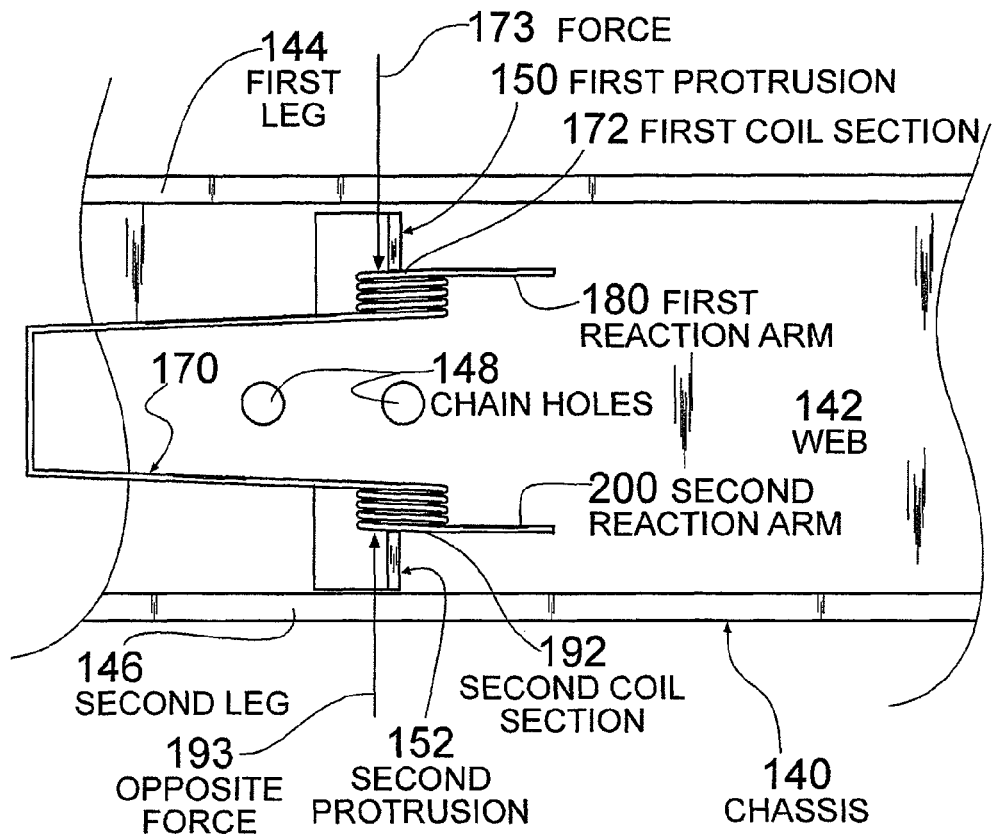
FIG. 3 is a top plan view of the embodiment of FIG. 1a showing a spring interfaced with the chassis.
Figure 4:
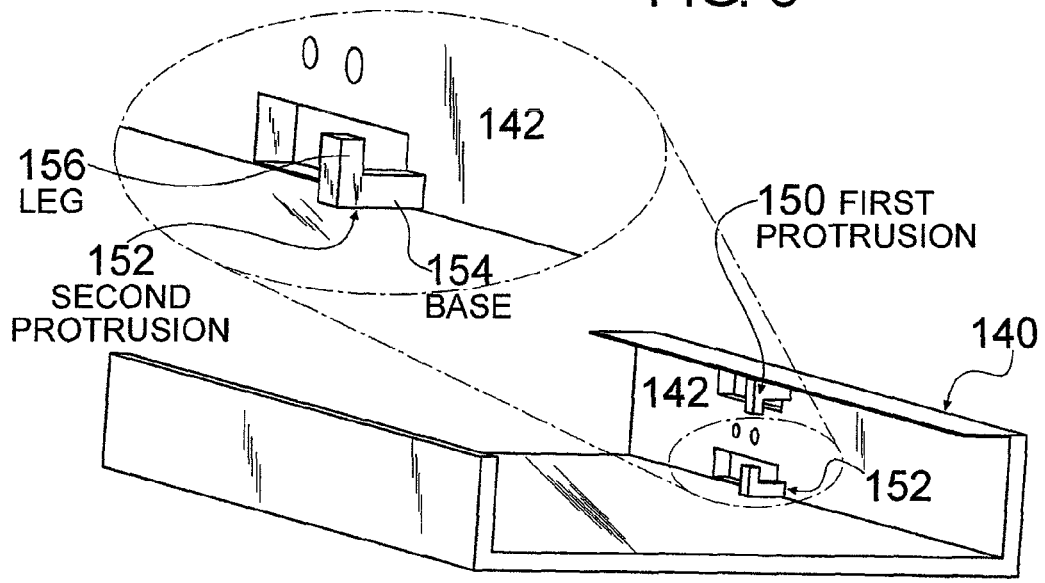
FIG. 4 is a perspective view of the embodiment of FIG. 3 detailing a second protrusion formed in the chassis for engaging the spring.

FIG. 3 illustrates one exemplary embodiment of the chassis 140. Chassis 140 may be configured with a c-channel section having a web 142, a first leg 144 and a second leg 146. The first and second legs 144, 146 may be individual components, or as illustrated in FIG. 4, integrally formed with the web 142 and made out of sheet metal. The chassis 140 may be configured with a variety of attachment points such as, for example, a pair of chain holes 148, a first protrusion 150 and a second protrusion 152.

FIG. 4 shows a perspective view of the chassis 140 of FIG. 3. The second protrusion 152 may be formed in an L-shape having a base 154 and an integrally formed leg 156. If integrally formed out of the chassis web 142, the second protrusion base 154 is perpendicular and attached to the web 142. The second protrusion leg 156 is integrally formed with the base 154 creating a feature that can capture the spring 170 as described below. The first protrusion 150 is essentially a mirror copy of the second protrusion 152 and components thereof, e.g. base 154 and leg 156.

FIG. 5 shows a perspective view of one exemplary embodiment of the spring 170. The spring 170 is made of any of a variety of spring materials, e.g. steel, and provided with a first coil section 172 defining a first end 174 and a second end 176, a first lever arm 178 and a first reaction arm 180. The first lever arm 178 protrudes from the first coil section first end 174 and the first reaction arm 180 protrudes from the first coil section second end 176. The spring 170 may be provided with an interface arm 182 integrally formed on the end of the first lever arm 178 opposite of the first coil section 172. The spring 170 provided with a second coil section 192 defining a first end 194 and a second end 196, a second lever arm 198 and a second reaction arm 200. The second lever arm 198 protrudes from the second coil section first end 194 and the second reaction arm 200 protrudes from the second coil section second end 196. If the interface arm 182 is present, the interface arm 182 is integrally attached to the second lever arm 198 at a location opposite from the first lever arm 178.

FIG. 6 shows a top plan view of the spring 170 having the first coil section 172 is separated from the second coil section 192 by a spring separation distance 171. The configuration of the spring 170 allows for a force 173 and an equal but opposite force 193 to be applied to the coil sections 172, 192 causing this spring separation distance 171 to decrease. Once the forces 173, 193 are released, the spring separation distance 171 increases to its natural length but stopping short of its full spring separation distance 171 if it contacts any immovable components as described below.

With reference again to FIG. 1a, the cable chain return system 100 is provided with the customer replaceable unit (CRU) 210 such as, for example, a disk drive. This CRU 210 is able to translate relative to the chassis 140 in a first direction 211 and can be detached from the chassis 140 altogether. Detaching of the CRU 210 is useful when the customer needs to replace the CRU 210. The present cable chain return system 100 improves this replacement by providing access to the cable chain distal end 114 and electrical connectors located at the distal end 114. The cable chain 110, chassis 140, spring 170 and CRU 210 are assembled in sequential steps of: 1) installation of the spring 170 onto the chassis 140; 2) installation of the cable chain 110 onto the chassis 140, thereby securing the spring 170; and, 3) installation of the CRU 210. The above sequential list is provided for illustrative purposes only and is one example of an embodiment that allows for easy installation. It is noted that other assembly processes may be utilized in alternative embodiments presented herein or practiced.

Referring again to FIG. 3, the spring 170 is installed by a technician applying the first and second forces 173, 193 to the first and second coil sections 172, 192, respectively. As the spring separation distance 171 (FIG. 6) decreases it becomes possible to slide the coil sections 152, 172 under the legs (e.g. second protrusion leg 156, FIG. 4) of the first and second protrusions 150, 152, respectively. Upon locating the spring 170 as illustrated in FIG. 3, the technician can release the forces 173, 193 to cause the first and second coil sections 152, 172 to come into contact with the first and second protrusions 150, 152, respectively. In this orientation, the first and second reactions arms 180, 200 contact the chassis web 142 and the reaction arms 178, 198 are free to be pivoted about the coil sections 152, 172, as illustrated in FIG. 7.

Figure 7:
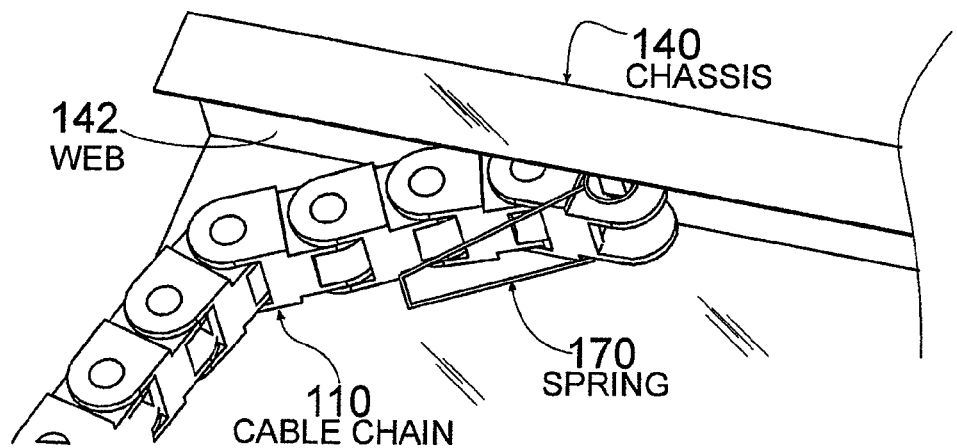
FIG. 7 is a perspective view of the cable chain being installed by a technician after the spring has been interfaced with the chassis as illustrated in FIG. 3.

FIG. 7 shows the spring 170 being manipulated by a technician (not shown). Following installation of the spring 170 described above, the cable chain 110 can be installed onto the chassis 140. This process is aided by the pair of chain holes 148 (FIG. 3) formed in the chassis web 142. As the spring 170 is manipulated by the technician, the cable chain proximal end 112 may be attached to the chassis 140 via the chain holes 148 (FIG. 3) and screws (not shown) located therein.

Figure 8:
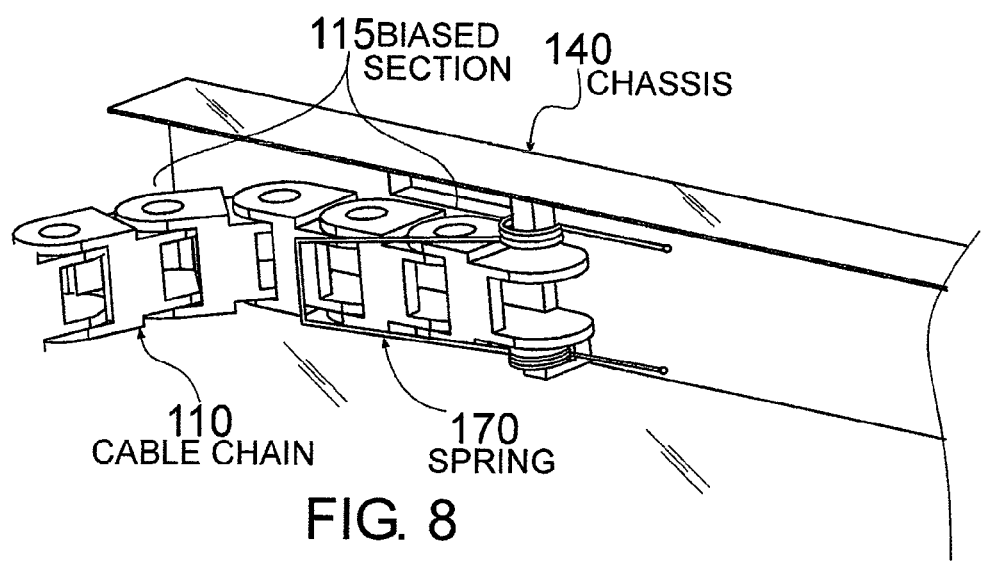
FIG. 8 is a perspective view of the cable chain return system of FIG. 7 after the cable chain has been installed and the spring biases a cable chain biased section adjacent to the chassis.

FIG. 8 shows a perspective view of the chassis 140 after the cable chain 110 is attached. The technician has released the spring 170 thereby causing the cable chain 110 to be biased against the chassis 140.

Referring again to FIG. 2, the process of installing the cable chain return system 100 is completed by attaching the CRU 210 to the distal end 114 of the cable chain 110. There are a variety of methods known in the industry for making electrical connections; the most common is manually attaching a connector (not shown) of the cables 118 to the CRU 210. This manual attachment of the cables 118 to the CRU 210 is possible due to the length of the cable chain 110 and the nature of the cable chain 110 itself (i.e. it can be consolidated, FIGS. 1a and 1b, or extended, FIG. 2).

Referring again to FIG. 1a, the foregoing description of initial installation of the CRU 210 is reversed and repeated by a user to aid in maintenance and/or repair of CRUs (e.g. CRU 210). The user can gain access to and impart a force on the CRU 210 causing it to move in the first direction 211 into an extended condition as illustrated in FIG. 2. The user can remove the CRU 210 by manually detaching the cables 118 (FIG. 1a) and replace the CRU 210 with a replacement CRU substantial like CRU 210. After this replacement, the user reverses the force on the CRU 210 causing the CRU 210 to move in a direction opposite from the first direction 211. Utilizing the return energy stored in the spring 170, the spring 170 urges the cable chain 110 towards the chassis 140 so that the process of folding the cable chain 110 when the CRU 210 is pushed into the retained position can be completed. The present cable chain return system aids in properly organizing the cable chain 110 during initial installation or replacement of the CRU 210.

Various alternative embodiments have been contemplated by the inventors, for example, the chassis 140 may be configured as a component of a larger assembly as illustrated in FIGS. 9-11. FIG. 9 is a perspective view of this embodiment of the chassis and a spring interfaced. FIG. 10 is a top plan view of the embodiment of the chassis and the interfaced spring of FIG. 9. FIG. 11 is a cross-sectional view of the embodiment of the chassis and the interfaced spring taken across plane 11-11 of FIG. 10.

The foregoing description of the invention has been presented for purposes of illustration and description. It is not intended to be exhaustive or to limit the invention to the precise form disclosed, and other modifications and variation may be possible in light of the above teachings. The embodiment was chosen and descried in order to best explain the principles of the invention and its practical applications to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of returning a cable chain from an extended position to a retained position, said method comprising:
    providing a cable chain made from a plurality of links having a limited arc of rotation, said links periodically reversed on said articulated cable chain so that said cable chain forms a plurality of folding curves in sequentially opposite directions along said cable chain when said cable chain is in said retained position, said cable chain defining:
        a proximal end attached to said chassis,
        a distal end oppositely disposed from said proximal end and attached to said customer replaceable unit; and,
        a biased section adjoining said proximal end;
    placing a spring adjacent to said cable chain proximal end that engages said cable chain biased section and said chassis so that said spring biases said cable chain biased section towards said chassis to initiate forming of said plurality of folding curves when said customer replaceable unit is moved from said extended position to said retained position.

2. The method of claim 1 and further comprising:
    said placing said spring comprises providing said spring comprising:
        a first coil section and a second coil section integrally formed with said first coil section; and,
    attaching said cable chain to said chassis between said spring first and second coil sections, after said placing said spring.

3. The cable chain return system of claim 1 where said chassis comprises server and said customer replaceable unit comprises a disk drive.

4. A cable chain return system connected to a customer replaceable unit and a chassis, said cable chain return system comprising:
    a cable chain made from a plurality of links that have a limited arc of rotation, said links periodically reversed on said cable chain so that said cable chain forms a plurality of folding curves in sequentially opposite directions along said cable chain when said a cable chain is in a retained position, said cable chain defining:
        a proximal end attached to said chassis,
        a distal end oppositely disposed from said proximal end and attached to said customer replaceable unit,
        a biased section adjoining said proximal end; and,
    a spring attached to said chassis adjacent to said cable chain proximal end adjoining said cable chain biased section, said spring disposed on said chassis to bias said cable chain biased section towards said chassis for initiating said plurality of folding curves when said cable chain moves from an extended position to said retained position.

5. The cable chain return system of claim 4 and said spring further comprising:
    a first coil section defining a first end and an oppositely disposed second end;

a first lever arm protruding from the first coil section first end and adjacent to said cable chain for transferring a force from said spring to said cable chain; and, a first reaction arm protruding from the first coil section second end and adjacent to said chassis for counteracting said force thereby keeping said first coil from rotating.

6. The cable chain return system of claim 5 and further comprising:

an interface arm integrally formed on said first lever arm oppositely disposed from said first coil section and contacting said cable chain biased section to transfer said force from said spring to said cable chain;

a second lever arm integrally formed on said interface arm oppositely disposed from said first lever arm;

a second coil section integrally formed on said second lever arm oppositely disposed from said interface arm, said coils are separated by said cable chain proximal end to provide a balanced transfer of forces from said coils to said cable chain; and, a second reaction arm integrally formed on said second coil section oppositely disposed from said second lever arm for countering a force from said second coil section to said cable chain via said interface arm.

7. The cable chain return system of claim 5 and further comprising:

a protrusion formed in said chassis that is adjacent to said spring first coil that interfaces said spring to said chassis.

8. The cable chain return system of claim 4 and further comprising:

said chassis comprises a server; and, said customer replaceable unit comprises a disk drive.

9. A method of installing a cable chain return system for a customer replaceable unit in a chassis that extends from said chassis, said method comprising:

providing a cable chain made from a plurality of links that have a limited arc of rotation, said links periodically reversed on said articulated cable chain so that said cable chain forms a plurality of folding curves in sequentially opposite directions along said cable chain when said cable chain is in a retained position, said cable chain defining a proximal end and an oppositely disposed distal end;

providing a spring comprising: a first coil section and a second coil section integrally formed with said first coil section;

squeezing said spring first and second coil sections towards each other;

positioning said spring adjacent to said chassis, after said squeezing said spring;

releasing said spring, after said positioning said spring;

positioning said cable chain proximal end between said first coil section and said second coil section, after said releasing said spring; and, attaching said cable chain to said chassis between said spring first and second coil sections thereby installing said cable chain return.

10. The method of claim 9 and further comprising:

providing a first protrusion formed in said chassis; and, before positioning said spring adjacent to said chassis, positioning said first coil section into contact with said chassis first protrusion.

11. The method of claim 10 and further comprising:

providing a second protrusion formed in said chassis so that said positioning said spring adjacent to said chassis places said second coil section into contact with said chassis second protrusion.

* * * * *